US010768730B2

(12) United States Patent
Kim

(10) Patent No.: US 10,768,730 B2
(45) Date of Patent: Sep. 8, 2020

(54) DISPLAY DEVICE AND INSPECTION METHOD OF BONDING RESISTANCE

(71) Applicant: Samsung Display Co., Ltd., Yongin-si (KR)

(72) Inventor: Young Bin Kim, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 2 days.

(21) Appl. No.: 16/044,021

(22) Filed: Jul. 24, 2018

(65) Prior Publication Data

US 2019/0212850 A1    Jul. 11, 2019

(30) Foreign Application Priority Data

Jan. 10, 2018   (KR) .................. 10-2018-0003575

(51) Int. Cl.
```
G06F 3/041      (2006.01)
G09G 3/3258     (2016.01)
G09G 3/3275     (2016.01)
G09G 3/00       (2006.01)
G06F 3/0354     (2013.01)
```
(Continued)

(52) U.S. Cl.
CPC ........ *G06F 3/0412* (2013.01); *G06F 3/03547* (2013.01); *G06F 3/0443* (2019.05); *G06F 3/04164* (2019.05); *G09G 3/006* (2013.01); *G09G 3/3258* (2013.01); *G09G 3/3275* (2013.01); *H01L 24/85* (2013.01); *B23K 20/004* (2013.01); *G06F 2203/04112* (2013.01); *G09G 2300/0426* (2013.01); *G09G 2300/0452* (2013.01); *G09G 2310/0264* (2013.01)

(58) Field of Classification Search
CPC ....... G06F 2203/04112; G06F 3/03547; G06F 3/0412; G09G 2310/0264; G09G 3/3258; G09G 3/3275
USPC .................................................. 345/173–174
See application file for complete search history.

(56) References Cited

U.S. PATENT DOCUMENTS

2005/0041002 A1*  2/2005  Takahara ............. G09G 3/3241
                                                            345/76
2012/0320581 A1* 12/2012  Rogers .................... H01L 24/24
                                                            362/235

(Continued)

FOREIGN PATENT DOCUMENTS

KR    1020140110344    9/2014
KR      101543020      8/2015

(Continued)

*Primary Examiner* — Kwin Xie
(74) *Attorney, Agent, or Firm* — Cantor Colburn LLP

(57) ABSTRACT

A display device includes a plurality of pixels, a plurality of data lines connected to the pixels, an inspection circuit unit connected to the data lines, a driving circuit unit connected or configured to be connectable to the data lines, a bonding region comprising a first pad, a second pad, a third pad, and a fourth pad, the first pad and the second pad being electrically connected to each other through a first conductor, and the third pad and the fourth pad being electrically connected to each other through a second conductor, a first wire connected to the driving circuit unit and the third pad, a second wire connected to the driving circuit unit and the inspection circuit unit and a third wire connected to the inspection circuit unit and the first pad, where the second pad and the fourth pad are electrically connected to each other.

20 Claims, 13 Drawing Sheets

(51) Int. Cl.
  *G06F 3/044* (2006.01)
  *H01L 23/00* (2006.01)
  *B23K 20/00* (2006.01)

(56) References Cited

U.S. PATENT DOCUMENTS

| | | | | |
|---|---|---|---|---|
| 2015/0262528 A1* | 9/2015 | Takahara | ............ | G09G 3/3225 345/212 |
| 2016/0013142 A1* | 1/2016 | Maeda | .................... | H01L 24/85 257/751 |
| 2018/0120971 A1* | 5/2018 | Lee | ......................... | G06F 3/044 |
| 2019/0204957 A1* | 7/2019 | Nakagome | .............. | G06F 3/041 |

FOREIGN PATENT DOCUMENTS

| KR | 101587428 | 2/2016 |
|---|---|---|
| KR | 1020170033966 | 3/2017 |

\* cited by examiner

DISPLAY DEVICE AND INSPECTION METHOD OF BONDING RESISTANCE

This application claims priority to Korean Patent Application No. 10-2018-0003575 filed on Jan. 10, 2018, and all the benefits accruing therefrom under 35 U.S.C. § 119, the content of which in its entirety is herein incorporated by reference.

BACKGROUND (a) Technical Field

Exemplary embodiments of the invention relate to a display device and an inspection method of a bonding resistance.

(b) Description of the Related Art

A display device such as a liquid crystal display ("LCD") and an organic light emitting diode display ("OLED display") include a display panel including a plurality of pixels capable of displaying an image. Each pixel includes a pixel electrode receiving a data signal, and the pixel electrode may be connected to at least one transistor to receive a data voltage.

A manufacturing process of the display device includes a process of forming the display panel through a thin film stacking process, a driving circuit mounting process, a module assembly process, various inspection processes, etc.

The driving circuit mounting process as a process of connecting a driving circuit unit to the display panel may include a process of bonding an integrated driving circuit chip to the display panel, connecting a circuit board (a printed circuit board) to the display panel through other circuit boards (flexible circuit substrates), directly bonding the circuit board to the display panel, or bonding two or more circuit boards to each other. The circuit board may be a film type. The driving circuit chip may be mounted on the circuit film.

The inspection process includes an inspection step after the driving circuit mounting process.

SUMMARY

Exemplary embodiments of the invention provide a display device and an inspection method of a bonding resistance capable of quickly and easily inspecting a bonding resistance between the display panel and the circuit board or between two or more circuit boards after the driving circuit mounting process. Exemplary embodiments of the invention also provide a display device and an inspection method of a bonding resistance capable of inspecting the bonding resistance after assembly of a module of the display device and capable of inspecting the bonding resistance without damage to an appearance of the display device.

According to an exemplary embodiment, a display device includes a plurality of pixels disposed in a display area, a plurality of data lines connected to the plurality of pixels, an inspection circuit unit disposed in a peripheral area outside the display area and connected to the data lines, a driving circuit unit disposed in the peripheral area and connected or configured to be connectable to the data lines, a first wire and a second wire connected to the driving circuit unit, a third wire connected to the inspection circuit unit, and a bonding region including at least two substrates and a plurality of pads, where the inspection circuit unit includes a first switching element and a second switching element, the first switching element is electrically connected to a first data line among the plurality of data lines and to the third wire, the second switching element is electrically connected to a second data line among the plurality of data lines and to the second wire, the plurality of pads includes a first pad, a second pad, a third pad, and a fourth pad, where the first pad and the second pad are electrically connected to each other via a first conductor, and the third pad and the fourth pad are electrically connected to each other via a second conductor, the second pad and the fourth pad are disposed on a same substrate of the at least two substrates and are electrically connected to each other through a connection part disposed on the same substrate, and the first pad is electrically connected to the third wire, and the third pad is electrically connected to the first wire.

According to an exemplary embodiment, a display device includes a display panel including a display area and a peripheral area disposed outside the display area, a first circuit board bonded to the display panel, and a second circuit board bonded to the first circuit board, where the display panel includes a plurality of pixels disposed in the display area, a plurality of data lines connected to the plurality of pixels, an inspection circuit unit disposed in the peripheral area and connected to the data lines, a driving circuit unit disposed in the peripheral area, a first wire and a second wire connected to the driving circuit unit, and a third wire connected to the inspection circuit unit, the first circuit board and the second circuit board include a bonding region including a plurality of pads, the inspection circuit unit includes a first switching element and a second switching element, the first switching element is electrically connected to a first data line among the plurality of data lines and to the third wire, the second switching element is electrically connected to a second data line among the plurality of data lines and to the second wire, the plurality of pads includes a first pad and a second pad electrically connected to each other via a first conductor, and a third pad and a fourth pad electrically connected via a second conductor, the second pad and the fourth pad are disposed at the second circuit board and are electrically connected to each other, and the first pad is electrically connected to the third wire, and the third pad is electrically connected to the first wire.

According to an exemplary embodiment, a display device includes a plurality of pixels, a plurality of data lines connected to the plurality of pixels, an inspection circuit unit connected to the plurality of data lines, a driving circuit unit connected or configured to be connectable to the plurality of data lines, a bonding region including a first pad, a second pad, a third pad, and a fourth pad, where the first pad and the second pad are electrically connected to each other through a first conductor, and the third pad and the fourth pad are electrically connected to each other through a second conductor, a first wire connected to the driving circuit unit and the third pad, a second wire connected to the driving circuit unit and the inspection circuit unit, and a third wire connected to the inspection circuit unit and the first pad, where the second pad and the fourth pad are electrically connected to each other.

According to an exemplary embodiment, an inspection method of a bonding resistance in a display device including a plurality of pixels, a plurality of data lines connected to the plurality of pixels, an inspection circuit unit connected to the plurality of data lines, a driving circuit unit connected or configured to be connectable to the plurality of data lines, a bonding region including a first pad and a second pad electrically connected to each other through a first conductor, and a third pad and a fourth pad electrically connected to each other through a second conductor, a first wire connected to the driving circuit unit and the third pad, a second wire connected to the driving circuit unit and the inspection circuit unit, and a third wire connected to the inspection circuit unit and the first pad, where the second pad and the fourth pad are electrically connected to each other, the method including applying a first inspection data voltage of a first gray level to the first wire and the second wire by the driving circuit unit, applying a second inspection data voltage of a second gray level to the first wire and the second wire by the driving circuit unit, and inspecting a lighting state of the plurality of pixels and determining whether a bonding resistance of the bonding region is normal.

According to exemplary embodiments of the invention, the bonding resistance of the display device may be quickly and easily inspected after mounting the driving circuit on the display panel. Also, the inspection of the bonding resistance may be possible after assembly of the module of the display device and the inspection of the bonding resistance may be possible without damage to an appearance of the display device.

DETAILED DESCRIPTION

Figure 1:
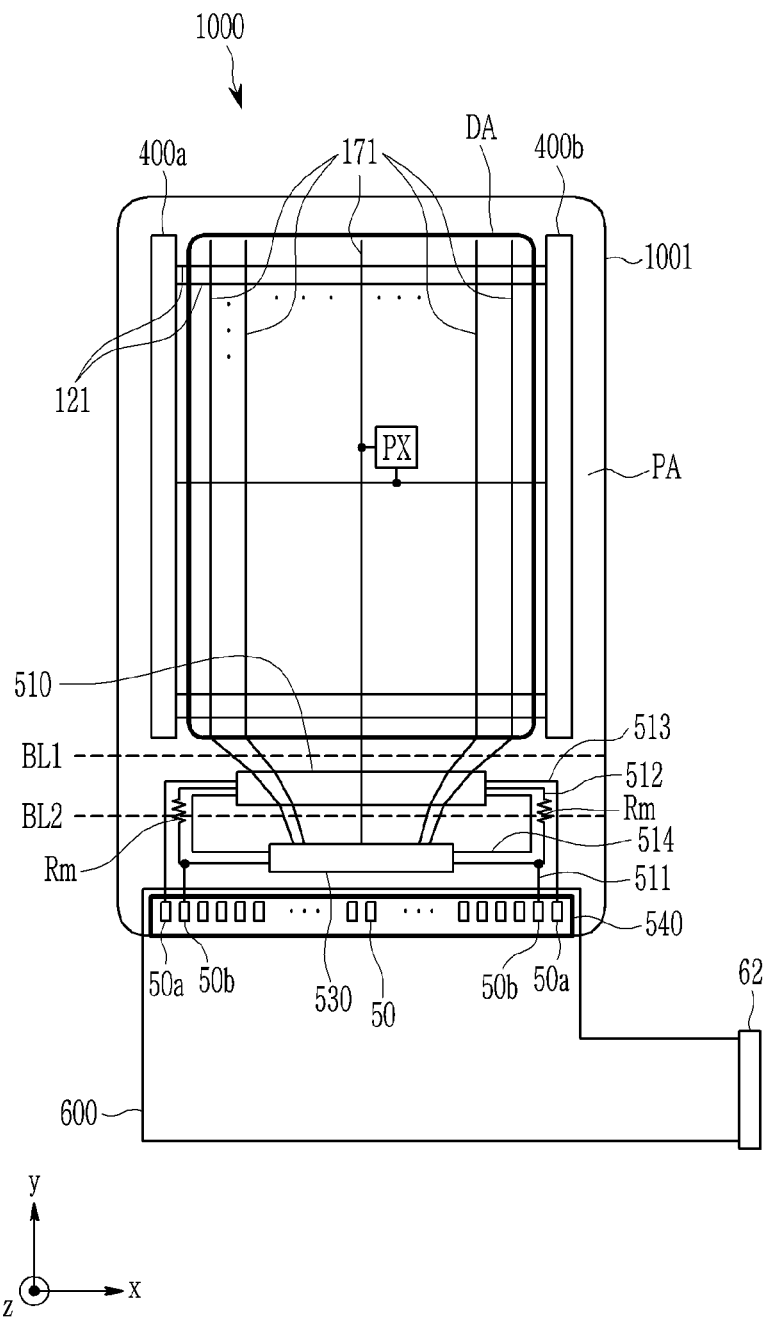
FIG. 1 is a plan view of an exemplary embodiment of a display device according to the invention.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

The drawings and description are to be regarded as illustrative in nature and not restrictive, and like reference numerals designate like elements throughout the specification.

In addition, the size and thickness of each configuration shown in the drawings are arbitrarily shown for better understanding and ease of description, but the invention is not limited thereto. In the drawings, the thickness of layers, films, panels, regions, etc., are exaggerated for clarity. In the drawings, for better understanding and ease of description, the thickness of some layers and areas is exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" means positioning on or below the object portion, but does not essentially mean positioning on the upper side of the object portion with respect to a gravity direction.

In addition, unless explicitly described to the contrary, the word "comprise" and variations such as "comprises" or "comprising" will be understood to imply the inclusion of stated elements but not the exclusion of any other elements.

Throughout this specification, a plan view means a view observing a surface defined by two directions (e.g., an x direction and an y direction) crossing each other, and a cross-sectional view means a view observing a surface cut in a direction (e.g., a z direction) perpendicular to the surface parallel to the x direction and the y direction. Also, to overlap two constituent elements means that two constituent elements are overlapped in the z direction (e.g., a direction perpendicular to an upper surface of the substrate) unless stated otherwise.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/ or." As used herein, the term "and/or" includes any and all combinations of one or more of the associated listed items.

Referring to FIG. 1, a display device 1000 according to exemplary embodiment includes a display panel 1001 and a circuit board 600 connected to the display panel 1001.

The display panel 1001 includes a display area DA and a peripheral area PA outside the display area DA. The display panel 1001 may include a substrate. The substrate may include an insulating material such as glass and plastic, and may have flexibility. In an exemplary embodiment, the substrate may include, for example, various plastics such as polyethylene terephthalate ("PET"), polyethylene naphthalate ("PEN"), polycarbonate ("PC"), polyarylate ("PAR"), polyetherimide ("PEI"), polyethersulfone ("PES"), or polyimide ("PI"), a metal thin film, or a thin film glass. The substrate may be a film type. At least part of the display panel 1001 may be deformable, thereby being bent during usage. Alternatively, the display panel 1001 may be almost ridge, thereby maintaining a fixed panel shape such as a flat shape, a curved state, a bent shape during a manufacturing process.

The display area DA may display the image on a surface defined by the x direction and the y direction. The display area DA includes a plurality of pixels PX and a plurality of signal lines 121 and 171.

Each pixel PX may include at least one switching element and a pixel electrode connected thereto. The switching element may be a three-terminal element such as a transistor integrated with the display panel 1001.

The signal lines 121 and 171 may include a plurality of gate lines 121 connected to control terminals (i.e., gates) of the switching elements of the pixels PX to transmit gate signals and a plurality of data lines 171 transmitting data signals to the pixels PX. The switching element of the pixel PX is turned on or turned off depending on the gate signal such that the data signal transmitted by the data line 171 may be selectively transmitted to the pixel electrode of the pixel PX. Each gate line 121 approximately extends in the x direction in the display area DA, and each data line 171 crosses the plurality of gate lines 121 in the display area DA and approximately extends in the y direction.

In the peripheral area PA, gate drivers 400a and 400b, a driving circuit unit 530, a pad unit 540, an inspection circuit unit 510, etc. may be disposed.

The gate drivers 400a and 400b may be disposed in right and left portions of the peripheral area PA, respectively, with respect to the display area DA. The gate drivers 400a and 400b may be connected to the gate lines 121 to transmit the gate signals. The gate drivers 400a and 400b may be provided on the substrate with the plurality of signal lines and switching elements disposed in the display area DA. Either one of the gate drivers 400a and 400b may be omitted.

The driving circuit unit 530 is disposed at the lower portion of the peripheral area PA with respect to the display area DA, and may be particularly disposed between the pad unit 540 and the display area DA. The driving circuit unit 530 may output driving signals to drive the display device 1000. The driving circuit unit 530 may include a driving circuit chip that is bonded or connected to the display panel 1001. The data lines 171 may extend into the peripheral area PA to be connected to the driving circuit unit 530 and may receive the data signals from the driving circuit unit 530.

The pad unit 540 is disposed at the lower portion of the peripheral area PA with respect to the display area DA and may be disposed at a position close to the lower edge of the display panel 1001. The pad unit 540 includes a plurality of pads 50. The pads 50 may form at least one row, and the pads 50 may be arranged approximately in the x direction in each row.

The circuit board 600 may include a plurality of pads (or referred to as bumps) for the connection to the display panel 1001. The circuit board 600 overlaps the pad unit 540 of the display panel 1001 and may be bonded and electrically connected to the pad unit 540. The circuit board 600 may include a connector 62 for receiving a signal from the outside. The circuit board 600 may include wires for transmitting the received signal and may be a flexible film type.

The inspection circuit unit 510 is disposed at the lower portion of the peripheral area PA with respect to the display area DA and may be particularly disposed between the pad unit 540 and the driving circuit unit 530. The inspection circuit unit 510 is connected to the data lines 171, and includes a circuit capable of inspecting a bonding resistance (also referred to as contact resistance, press resistance, etc.) described later. The bonding resistance may be detected by inspecting a lighting stage of the display area DA through the inspection circuit unit 510. The inspection circuit unit 510 may be disposed on the substrate with the plurality of signal lines and switching elements disposed in the display area DA.

The inspection circuit unit 510 may be electrically connected to the driving circuit unit 530 and/or the pad unit 540 through a plurality of wires 511, 512, 513, and 514. The wire 511 may be connected to one pad 50b among the pads 50 of the pad unit 540 and the driving circuit unit 530, the wire 512 may be connected to the inspection circuit unit 510 and the driving circuit unit 530, the wire 513 may be connected to the inspection circuit unit 510 and one pad 50a of the pad unit 540, and the wire 514 may be connected to the inspection circuit unit 510 and the driving circuit unit 530.

The wire 512 may include a matching resistor Rm. The wire 511 may be electrically connected to the wire 512 between the matching resistor Rm and the driving circuit unit 530. The wire 511 and the wire 512 may receive an inspection data voltage from the driving circuit unit 530 and transmit the inspection data voltage to the inspection circuit unit 510, the wire 513 may receive a detection voltage from the pad unit 540, and the wire 514 may receive a gate signal for the inspection circuit unit 510 from the driving circuit unit 530 and transmit the gate signal to the inspection circuit unit 510. The gate signal for the inspection circuit unit 510 may be different from the gate signal transmitted through the gate lines 121.

The wires 511, 512, 513, and 514, as shown in FIG. 1, are disposed symmetrically with respect to the inspection circuit unit 510 and the driving circuit unit 530 in the peripheral area PA and may be formed of the same structure.

At least one of the pads 50a and 50b may be disposed adjacent or close to both ends of the pad unit 540 that is elongated. That is, at least one of the pads 50a and 50b may be disposed closer to the edge than to the center of the pad unit 540. Another pad among the plurality of pads 50 may be further disposed between the two pads 50a and 50b.

The display panel 1001 may be folded (bent) at the lower portion of the peripheral area PA with respect to the display area DA. In an exemplary embodiment, for example, the display panel 1001 is bent along a bending reference line BL1 or a bending reference line BL2 shown in FIG. 1 such that a part below the bending reference line BL1 or the bending reference line BL2 may be wrapped to the back side of the display panel 1001, thereby being invisible from the front (i.e., in a front plan view). FIG. 1 shows the display panel 1001 of the state that is not bent (i.e., unfolded).

In an alternative exemplary embodiment, the display panel 1001 may maintain the flat state without the bent part. In this case, the circuit board 600 may be bent at the lower end of the display panel 1001 to be wrapped to the back side of the display panel 1001, thereby being invisible in a front plan view.

Each of the data lines 171 and the wires 511, 512, 513, and 514 as one elongated signal line in a front plan view may be disposed at one conductive layer, or may be disposed at a plurality of conductive layers in a cross-sectional view and include other portions that are electrically connected to each other.

Figure 2:
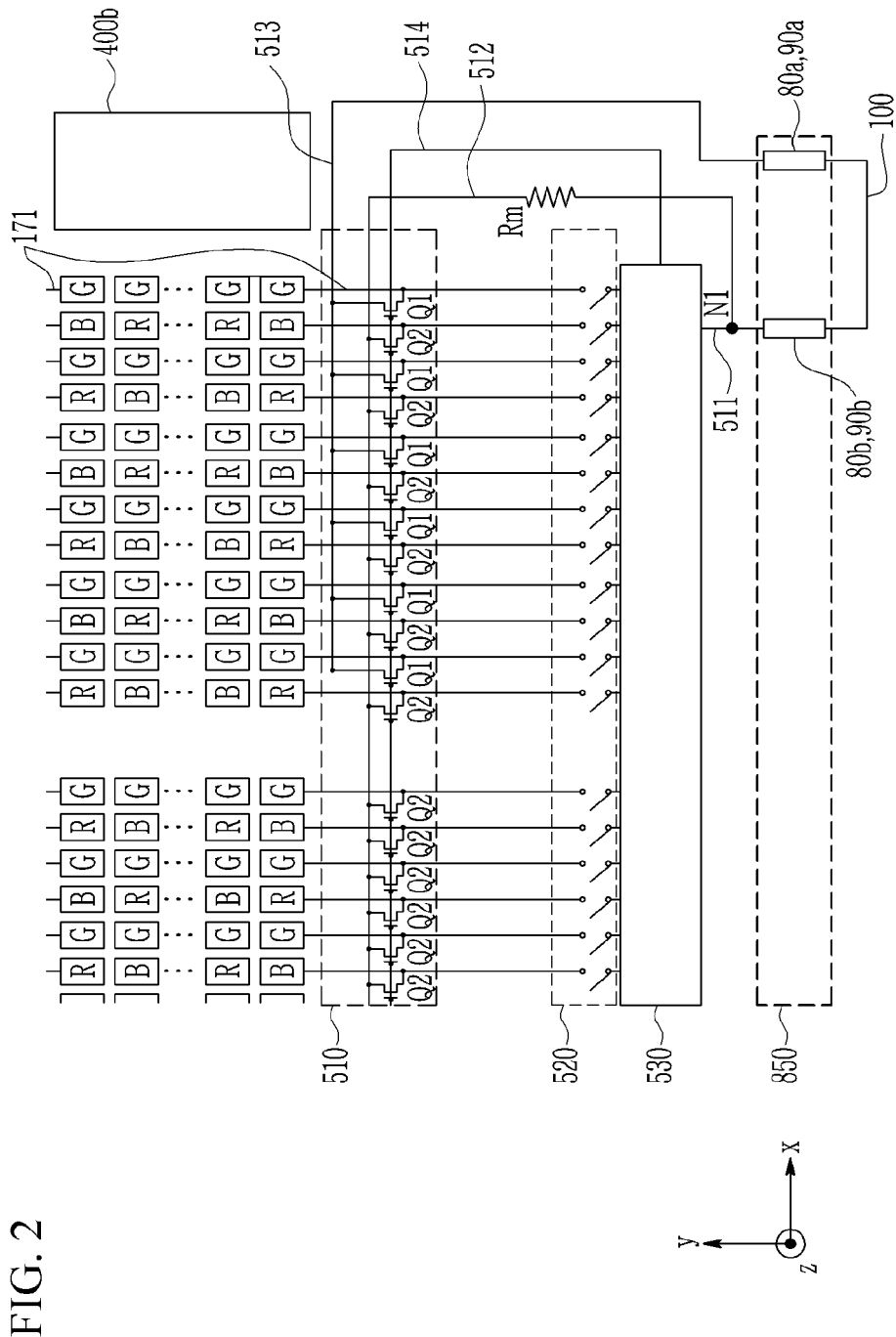
FIG. 2 is a plan view of an exemplary embodiment of a part of a display device according to the invention.

FIG. 2 shows the right lower portion of the display device 1000 shown in FIG. 1.

Referring to FIG. 1 and FIG. 2, the plurality of pixels PX may emit light of a specific color. In an exemplary embodiment, for example, the plurality of pixels PX may include a red pixel R emitting red light, a green pixel G emitting green light, and a blue pixel B emitting blue light. For example, four adjacent pixels in the form of a square may include two green pixels G, one red pixel R, and one blue pixel B. A pixel array (a column of pixels) only including the green pixel G and a pixel array including the red pixel R and the blue pixel B may be alternately arranged in the x direction. In a pixel array (a row of pixels) including the red pixel R and the green pixel G and a pixel array including the blue pixel B and the green pixel G may be alternately arranged in the y direction. However, the arrangement of the pixels PX is not limited thereto, and the pixels PX may be arranged in various ways.

The inspection circuit unit 510 includes a plurality of switching elements Q1 and Q2 connected to the data lines 171.

The control terminal of the switching element Q1 may be electrically connected to the wire 514 to receive the gate signal for the inspection circuit unit 510, the input terminal of the switching element Q1 may be electrically connected to the wire 513 to receive the detection voltage including the bonding resistance information, and the output terminal of the switching element Q1 may be electrically connected to the data lines 171.

The control terminal of the switching element Q2 may be electrically connected to the wire 514 to receive the gate signal for the inspection circuit unit 510, the input terminal of the switching element Q2 may be electrically connected to the wire 512 to receive the inspection data voltage, and the output terminal of the switching element Q2 may be electrically connected to the data lines 171 that are not connected to the switching element Q1. For example, the output terminal of the switching element Q2 may be electrically connected to the rest of the data lines 171 that are not connected to the switching element Q1 among the plurality of data lines 171.

The switching elements Q1 and Q2 may be approximately arranged in the x direction, and each of the switching elements Q1 and Q2 may be disposed to be connected to a corresponding data line 171.

The switching elements Q1 may be disposed at a partial region of the inspection circuit unit 510, for example, a region of the left part and/or the right part of the inspection circuit unit 510, and the switching elements Q2 may only be disposed in the center region of the inspection circuit unit 510

The number of switching elements Q1 at the region of the left part or the right part of the inspection circuit unit 510 and the pixel arrays connected thereto may be plural.

The color represented by the pixels R, G, and B that are electrically connected to the switching elements Q1 through the data line 171 may be a specific color. For example, as shown in FIG. 2, the switching elements Q1 may only be connected to the pixel arrays including the green pixel G, or alternatively, may only be connected to the pixel arrays including the red pixel R and the blue pixel B.

The wire 511 may be electrically connected to the wire 512 at a node N1 between the matching resistor Rm and the driving circuit unit 530. Accordingly, the wires 511 and 512 may receive substantially the same inspection data voltage from the driving circuit unit 530.

The matching resistor Rm may have a resistance value corresponding to (e.g., substantially same as) the bonding resistance when the bonding resistance is in a normal range. That is, the inspection data voltage of the wire 512 applied from the driving circuit unit 530 may be decreased by the voltage corresponding to the bonding resistance of the normal range through the matching resistor Rm, and then may be input to the switching element Q2 of the inspection circuit unit 510.

Referring to FIG. 1 and FIG. 2, the display device 1000 according to an exemplary embodiment may further include a selection unit 520 connected to the driving circuit unit 530. The selection unit 520 includes a plurality of switches connected to the driving circuit unit 530 and the data lines 171, thereby switching the application of the data signal for the data lines 171.

The display device 1000 according to an exemplary embodiment includes a bonding region 850. The bonding region 850 may include a region in which the circuit board (e.g., the circuit board 600) connected to the display panel 1001 and another circuit board connected thereto are bonded to each other, and/ or a region in which the display panel 1001 and the circuit board (e.g., the circuit board 600) connected thereto are bonded to each other. That is, the bonding region 850 may include only one bonding region among the several bonding regions included in the display device according to an exemplary embodiment, or may include a plurality of bonding regions that are electrically connected to each other. The bonding resistance to be inspected in the display device 1000 may be the bonding resistance in the bonding region 850.

Figure 3:
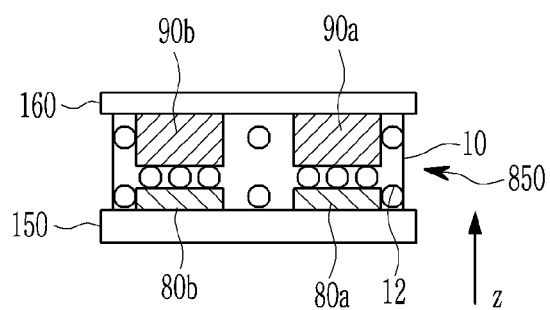
FIG. 3 is a cross-sectional view of an exemplary embodiment of a bonded part of a display device according to the invention.
Figure 4:
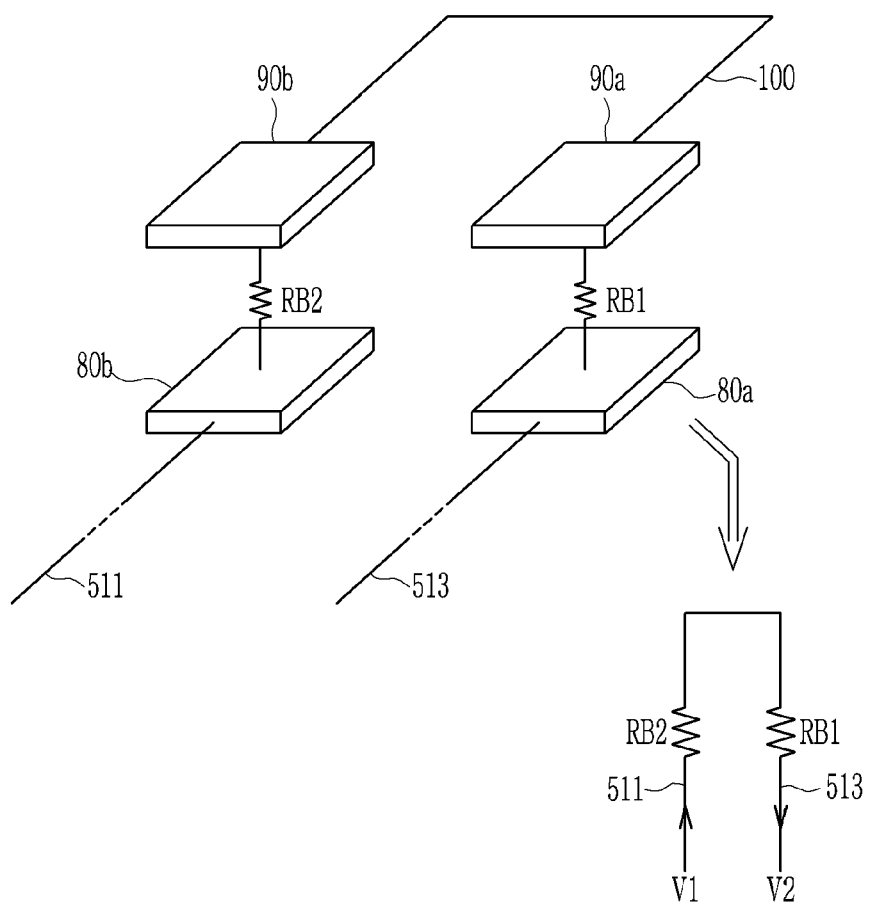
FIG. 4 and FIG. 5 are views showing an exemplary embodiment of constituent elements for measuring a bonding resistance of a display device according to the invention.

Referring to FIG. 2 to FIG. 4, the display device according to an exemplary embodiment includes two substrates 150 and 160 facing (i.e., overlapping) each other in a cross-sectional view, and the two substrates 150 and 160 may be bonded through a conductor in the bonding region 850.

The bonding may be obtained through an anisotropic conductive film (referred to as an ACF) 10 including a plurality of conductive balls 12. Pads 80a and 80b disposed at the upper surface of the substrate 150 correspond to and face pads 90a and 90b disposed at the lower surface of the substrate 160, respectively, and the conductive balls 12 of the ACF 10 are disposed between the pad 80a and the pad 90a and between the pad 80b and the pad 90b facing each other, thereby the pads 80a and 80b of the substrate 150 are electrically connected to the pads 90a and 90b of the substrate 160, respectively.

As above-described, the bonding resistance may include a sum of a value of a resistance RB1 between two pads 80a and 90a bonded and a value of a resistance RB2 between two pads 80b and 90b bonded.

The two pads 90a and 90b disposed at the substrate 160 to measure the bonding resistance are electrically connected to each other through a connection wire 100, thereby forming one shorting pad. Accordingly, the wire 511, the pad 80b, the pad 90b, the connection wire 100, the pad 90a, the pad 80a, and the wire 513 that are sequentially connected may form a circuit for measuring of the bonding resistance. Referring to FIG. 4, the wire 511 may transmit the inspection data voltage V1 to the pad 80b, and the wire 513 may transmit the detection voltage V2 including the bonding resistance information (e.g., the sum of two resistances RB1 and RB2).

Since the plurality of pads are arranged in any one direction at the bonding region 850, when the bonding region 850 extends along the direction, at least one among the pads 90a and 90b and the pads 80a and 80b connected thereto respectively may be disposed adjacent or close to both ends of the bonding region 850. That is, at least one pad among the pads 80a and 80b may be the pad disposed at the edge among the pads included in the bonding region 850 or the pads disposed at the position closer to the edge than to the center of the bonding region 850. In general, a bonding state between two substrates 150 and 160 is best at the center part of the bonding region 850 and is not good at the closer part to the both ends. That is, the bonding resistance at the end may be greater than that at the center of the bonding region 850. Accordingly, if the bonding resistance detected near the both edges of the bonding region 850 is inspected and found to be normal, it may be confirmed that the bonding state on the entire bonding region 850 is good.

Other pads included in the bonding region 850 may be disposed between the two pads 80*a* and 80*b*, and may also be disposed between the two pads 90*a* and 90*b*.

Figure 5:
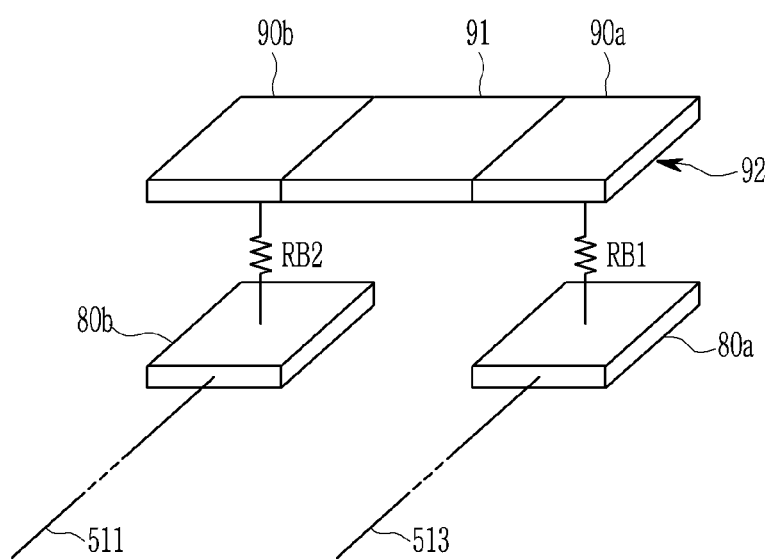

Referring to FIG. 5, differently from the exemplary embodiment shown in FIG. 4, two pads 90*a* and 90*b* disposed at the substrate 160 may be electrically connected to each other through a pad connection part 91 instead of the connection wire. That is, two pads 90*a* and 90*b* are not separated from each other and are connected to be one monolithic pad through the pad connection part 91, thereby forming one shorting pad 92 that is wider than each area of the pads 90*a* and 90*b* shown in FIG. 4.

Figure 6:
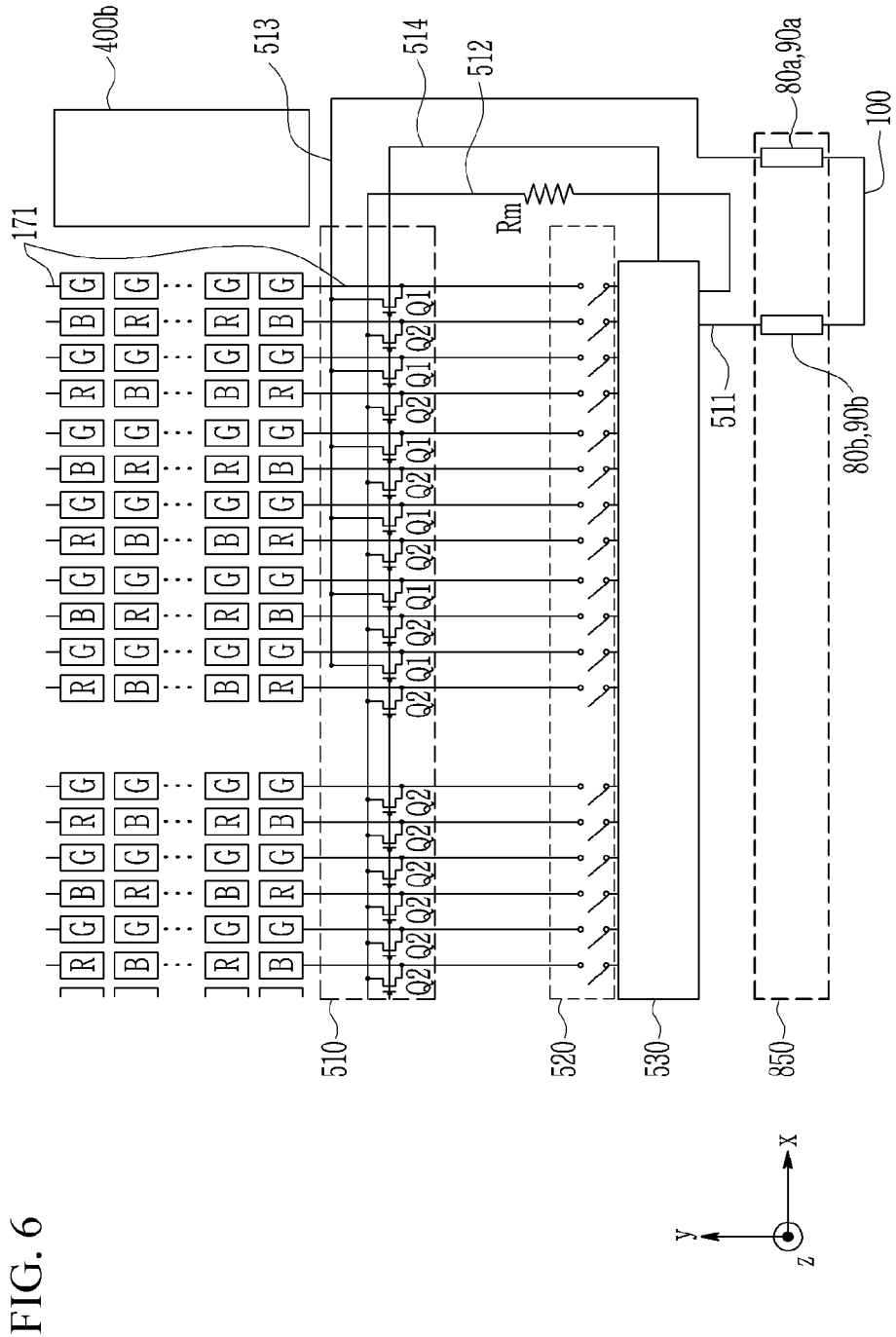
FIG. 6 is a plan view of another exemplary embodiment of a part of a display device according to the invention.

Referring to FIG. 6, differently from the exemplary embodiment shown in FIG. 1 and FIG. 2, the wire 511 is not electrically connected to the wire 512, but may be directly and independently connected to the driving circuit unit 530. Accordingly, the wire 512 may also be directly and independently connected to the driving circuit unit 530. Accordingly, the wires 511 and 512 may receive different inspection data voltages from each other or the same inspection data voltage from the driving circuit unit 530.

The method of inspecting the bonding resistance in the display device according to an exemplary embodiment with reference to FIG. 1 to FIG. 6 described above is now described.

First, the wires 511 and 512 receive a first inspection data voltage from the driving circuit unit 530. The first inspection data voltage, for example, may be the data voltage of a first gray level representing a highest gray level (e.g., a white gray level) by the pixels PX. Next, the wires 511 and 512 receive a second inspection data voltage from the driving circuit unit 530. The second inspection data voltage may be the data voltage of a second gray level representing a lowest gray level (e.g., a black gray level) by the pixels PX. The data voltage of the second gray level may be greater than the data voltage of the first gray level.

When the bonding resistance of the bonding region 850 is normal, the detection voltage input to the switching element Q1 of the inspection circuit unit 510 through the wire 513 after the sequence of voltage drops along the pad 80*b* connected to the wire 511, the pad 90*b* and the pad 90*a* shorted to each other, and the pad 80*a* may be the substantially same as a comparison voltage input to the switching element Q2 of the inspection circuit unit 510 after the voltage drop by the matching resistor Rm of the wire 512. For this, the matching resistor Rm may be previously controlled as the value of the normal bonding resistance. The detection voltage and the comparison voltage may be a voltage representing a third gray level (e.g., a gray level gradation between white and black) between the first gray level and the second gray level. In this case, all pixels PX of the display panel 1001 may emit substantially the same gray level.

In contrast, when the bonding resistance is abnormal in the bonding region 850, the detection voltage input to the switching element Q1 of the inspection circuit unit 510 through the wire 513 after the sequence of voltage drops along the pad 80*b* connected to the wire 511, the pad 90*b* and the pad 90*a* shorted to each other, and the pad 80*a* is lower than the comparison voltage input to the switching element Q2 of the inspection circuit unit 510 after the voltage drop by the matching resistor Rm of the wire 512. Accordingly, the comparison voltage may be the voltage representing the third gray level between the first gray level and the second gray level, or the detection voltage may be the voltage representing a fourth gray level different from the third gray level. In this case, the green pixels G connected to the switching element Q1 receiving the detection voltage are emitted with the different gray level from the red pixels R, and the blue pixels B connected to the switching element Q2 such that the lighting state of the display panel 1001 is different from the case that the bonding resistance is normal. For example, the fourth gray level is higher than the third gray level, and the green pixels G connected to the switching element Q1 are represented brighter than the red pixels R, and the blue pixels B connected to the switching element Q2 such that a bright line of a green color having a predetermined width may appear in the display area DA. In this case, it is determined that the bonding resistance is greater as the recognized line is brighter.

As above-described, according to the display device 1000 and the inspection method of the bonding resistance according to an exemplary embodiment, even though a probe of a separate resistance measuring device is not in contact with the display device (a non-contact type), because the normal state of the bonding resistance of the display device may be determined through the lighting stage of the display area DA, the bonding resistance may be quickly and easily inspected. Also, the bonding resistance inspection is possible during the manufacturing process of the display device, for example, after the module assembly, or in a completed product, and the bonding resistance inspection of the display device is possible without the appearance damage.

The bonding region 850 may be the various bonding regions in the display device, and accordingly the bonding resistance to be inspected may include the bonding resistances at various positions in the display device. This is sequentially described with reference to FIG. 7 to FIG. 11, FIG. 12, and FIG. 13 along with the above-described drawings.

First, referring to FIG. 7 to FIG. 11, a display device 1000*a* according to an exemplary embodiment is the same as most of the above-described display device 1000, except for that a circuit board 600*a* different from the circuit board 600 is included. The circuit board 600*a* may include a plurality of pads 60 that are bonded and electrically connected to the pads 50 of the pad unit 540 of the display panel 1001, and a pad unit 630 separated from the pads 60. The pad unit 630 may include a plurality of pads 61 that are electrically connected to at least part of the pads 60 through connection wires.

One pad 60*a* among the pads 60 is bonded and electrically connected to the pad 50*a* of the display panel 1001, and may be electrically connected to a pad 61*a* among the pads 61 of the pad unit 630 through a connection wire 612 on the circuit board 600*a*. Since the pad 50*a* connected to the pad 60*a* is connected to the inspection circuit unit 510 through the wire 513 in the display panel 1001, the pad 61*a* may also be electrically connected to the inspection circuit unit 510 through the wire 513.

The other pad 60*b* among the pads 60 is bonded and electrically connected to the pad 50*b* of the display panel 1001, and may be electrically connected to the pad 61*b* among the pads 61 of the pad unit 630 through a connection wire 611 on the circuit board 600*a*. Since the pad 50*b* connected to the pad 60*b* is connected to the driving circuit unit 530 through the wire 511 in the display panel 1001, the pad 61b may also be electrically connected to the driving circuit unit 530 through the wire 511.

When the pads 61 included in the pad unit 630 are arranged in one direction such that the pad unit 630 extends along the direction, the pads 61a and 61b may be disposed adjacent or close to the both ends of the elongated pad unit 630.

Another pad among the plurality of the pads 60 may be disposed between two pads 60a and 60b, and another pad among the plurality of the pads 61 of the pad unit 630 may also be disposed between two pads 61a and 61b.

Figure 7:
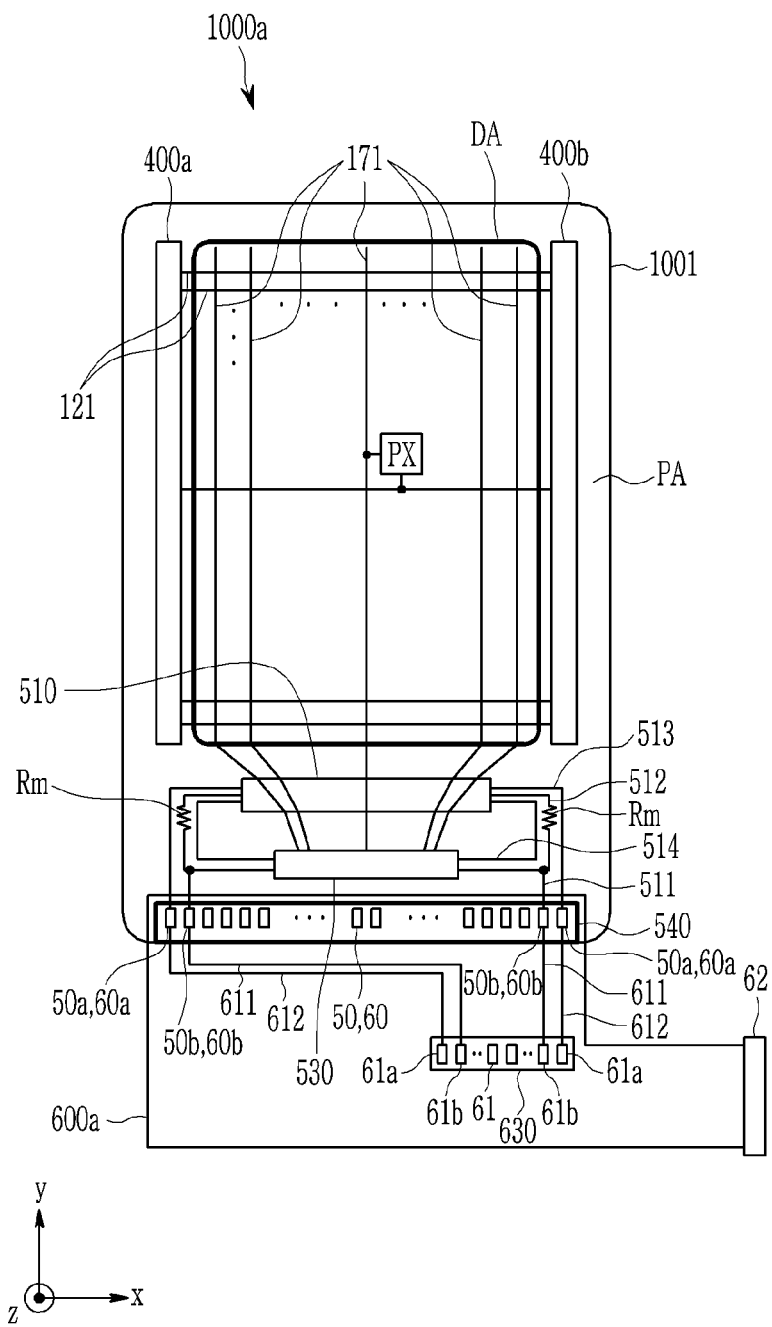
FIG. 7 is a plan view of another exemplary embodiment of a display device according to the invention.
Figure 8:
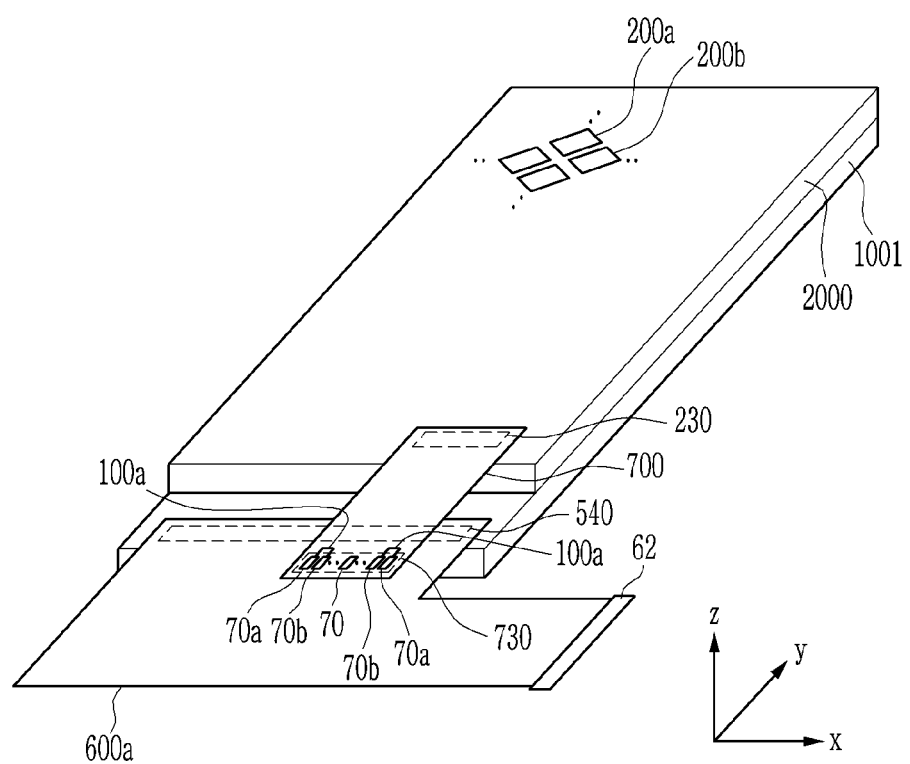
FIG. 8 and FIG. 9 are perspective views of an exemplary embodiment of a display device according to the invention.
Figure 9:
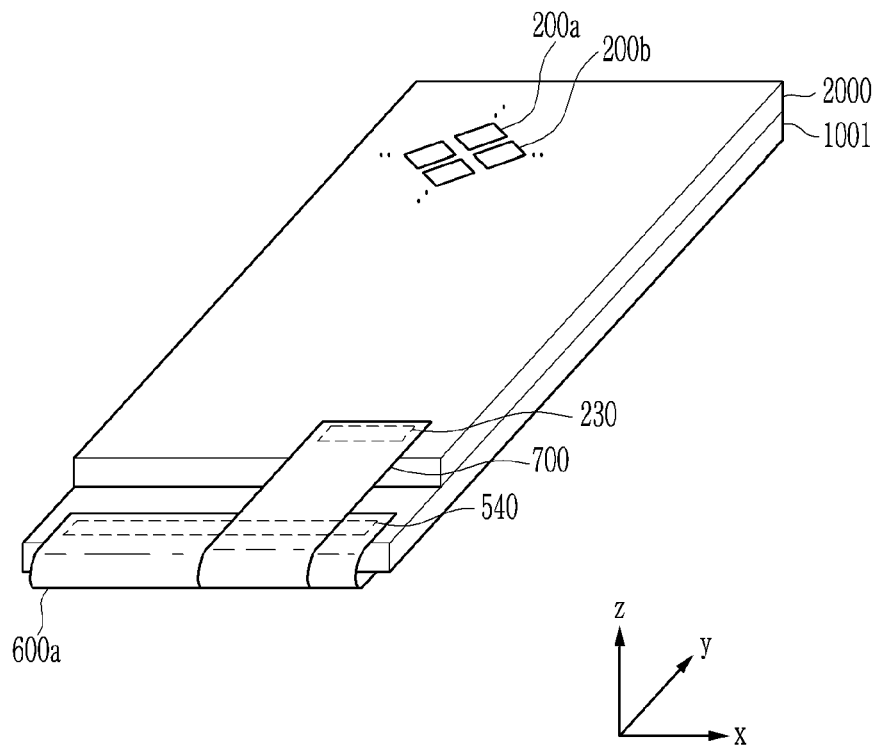

Referring to FIG. 8 and FIG. 9 along with FIG. 7, the display device 1000a according to an exemplary embodiment may further include a touch sensing layer 2000 capable of sensing a touch from the outside.

The touch sensing layer 2000 may include a plurality of touch electrodes 200a and 200b arranged in each row or each column in a plan view. The touch electrodes 200a and 200b may form touch sensors of a self-capacitive type, respectively, or the adjacent touch electrodes 200a and 200b may form a touch sensor of a mutual-capacitive type, thereby sensing the touch from the outside. In the case of the self-capacitive type, the touch electrodes 200a and 200b may be electrically connected to the touch wires connected to the pad unit 230 of the substrate included in the touch sensing layer 2000, respectively. In the case of the mutual-capacitive type, the touch electrodes 200a and 200b arranged in each row or each column are connected to each other and each row or each column may be connected to the pad unit 230 through each touch wire.

The touch sensing layer 2000 may be attached on the display panel 1001 or may be directly formed on the display panel 1001.

The touch sensing layer 2000 may be electrically connected to a touch circuit board 700 in which a circuit for sensing the touch is formed. The touch circuit board 700 may overlap the pad unit 230 of the touch sensing layer 2000 and be bonded to the pad unit 230. The touch circuit board 700 may include a wire transmitting signals and may be a flexible film type.

The touch circuit board 700 may include a pad unit 730 that is bonded and electrically connected to the pad unit 630 of the circuit board 600a. The pad unit 730 includes a plurality of pads 70. One pad 70a of the pads 70 is bonded and electrically connected to the pad 61a of the pad unit 630 of the circuit board 600a, and another pad 70b is bonded and electrically connected to the pad 61b of the pad unit 630 of the circuit board 600a.

When the pads 70 of the pad unit 730 are arranged in one direction such that the pad unit 730 extends along the direction, the pads 70a and 70b may be disposed adjacent to or close to both ends of the pad unit 730. In this exemplary embodiment, the extending direction of the pad unit 730 may be substantially the same as the extending direction of the pad unit 630 of the circuit board 600a.

Another pad among the plurality of the pads 70 included in the pad unit 730 may be disposed between the two pads 70a and 70b.

Referring to FIG. 9, the circuit board 600a and the touch circuit board 700 are bent together at the lower end of the display panel 1001 to be wrapped to the back side of the display panel 1001 such that most of the circuit board 600a and the touch circuit board 700 may be invisible in a front plan view.

Figure 10:
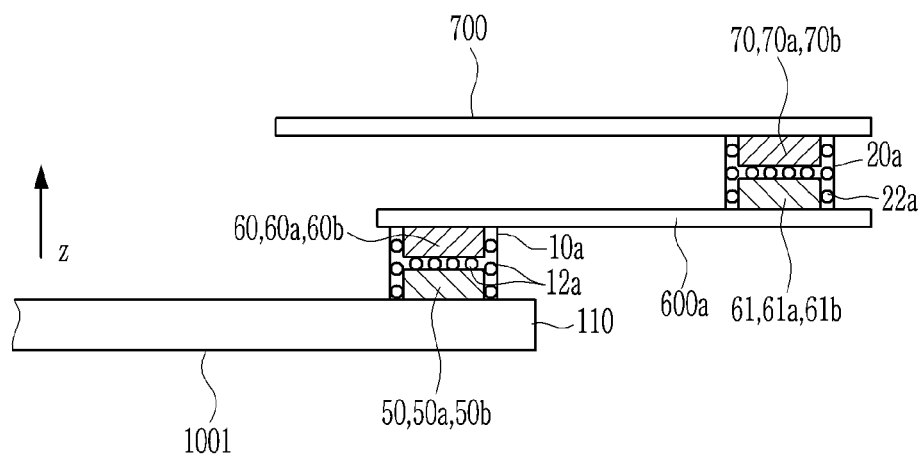
FIG. 10 is a cross-sectional view of an exemplary embodiment of a bonded part of a display device according to the invention.

Referring to FIG. 10, in a cross-sectional view, the display panel 1001, the circuit board 600a, and the touch circuit board 700 may be electrically connected to each other through the conductive bonding using ACFs 10a and 20a including conductive balls 12a and 22a. The pads 50 including the pads 50a and 50b disposed on the substrate 110 included in the display panel 1001 correspond to and face the pads 60 including the pads 60a and 60b disposed at the lower surface of the circuit board 600a, respectively. The conductive balls 12a of the ACF 10a may be disposed between the pads 50 including the pads 50a and 50b, and the pads 60 including the pads 60a and 60b, facing each other. Also, the pads 61 including the pads 61a and 61b disposed on the circuit board 600a correspond to and face the pads 70 including the pads 70a and 70b disposed at the lower surface of the touch circuit board 700, respectively, and the conductive balls 22a of the ACF 20a may be disposed between the pads 61 including the pads 61a and 61b, and the pads 70 including the pads 70a and 70b, facing each other.

Referring to FIG. 7 to FIG. 11, the bonding resistance to be inspected in this exemplary embodiment may include a sum of a value of the resistance RB3 between two pads 61a and 70a facing and bonded to each other between the touch circuit board 700 and the circuit board 600a and a value of the resistance RB4 between two pads 61b and 70b facing and bonded to each other, and further includes a sum of a value of the resistance RB5 between two pads 50a and 60a facing and bonded to each other between the circuit board 600a and the display panel 1001 and a value of the resistance RB6 between two pads 50b and 60b facing and bonded to each other.

The bonding region 850 in the above-described exemplary embodiment shown in FIG. 2 to FIG. 4 may include all of the pad unit 540 and the pad units 630 and 730 in the exemplary embodiment shown in FIG. 7 to FIG. 11, and the pads 80a and 80b of the bonding region 850 may correspond to the pads 50a and 50b, respectively.

For measuring of the bonding resistance, the two pads 70a and 70b disposed at the touch circuit board 700 are electrically connected to each other through a connection wire 100a or are directly connected to each other, thereby forming one shorting pad. Accordingly, the wire 511, the pad 50b, the pad 60b, the connection wire 611, the pad 61b, the pad 70b, the connection wire 100a, the pad 70a, the pad 61a, the connection wire 612, the pad 60a, the pad 50a, and the wire 513 that are sequentially connected may form the circuitry for measuring of the bonding resistance. The wire 511 may transmit the inspection data voltage to the pad 50b, and the wire 513 may transmit the detection voltage including the bonding resistance information (e.g., the sum of four resistances RB3, RB4, RB5, and RB6) to the inspection circuit unit 510.

As above-described, at least one pad among the pads 50a, 50b, 60a, 60b, 61a, 61b, 70a, and 70b for measuring of the bonding resistance may be adjacent or close to both ends of the pad unit thereof. If the bonding resistance detected near both end edges of the pad unit is inspected to be normal, it is determined that the bonding stage in the entire bonding region is also good.

The inspection method of the bonding resistance is the same as above-described such that the detailed description related thereto is omitted.

According to another exemplary embodiment, the bonding resistance to be inspected may only include the resistance RB3 between two pads 61a and 70a facing and bonded to each other between the touch circuit board 700 and the circuit board 600a, and the resistance RB4 between two pads 61b and 70b facing and bonded to each other. In this case, the bonding region 850 in the above-described exemplary embodiment shown in FIG. 2 to FIG. 4 includes two pads units 630 and 730 bonded to each other, the pads 80a and 80b of the bonding region 850 may correspond to the pads 61a and 61b, and the pads 90a and 90b may correspond to the pads 70a and 70b, respectively.

For example, when the bonding resistance between the display panel 1001 and the circuit board 600a is negligible, the bonding resistance information inspected through the lighting state of the display area DA may be interpreted as only the bonding resistances RB3 and RB4 between the circuit board 600a and the touch circuit board 700.

Figure 11:
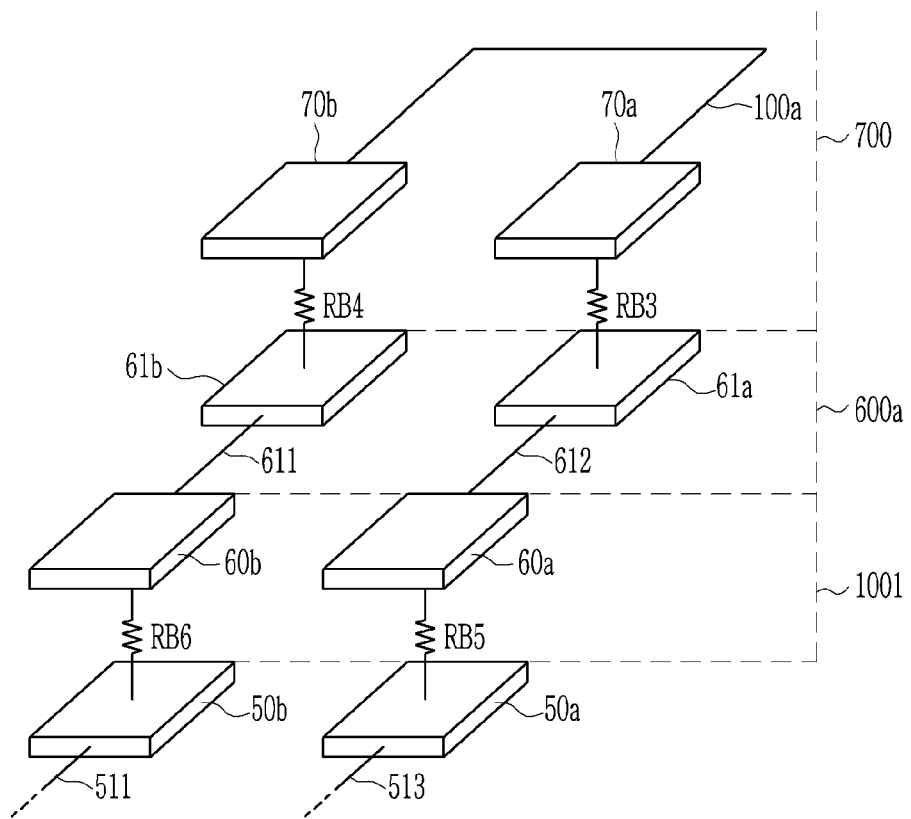
FIG. 11 is a view showing another exemplary embodiment of constituent elements for measuring a bonding resistance of a display device according to the invention.

When the bonding resistance between the display panel 1001 and the circuit board 600a is known, in this exemplary embodiment, the bonding resistance information inspected through the lighting state of the display area DA may be interpreted as only the bonding resistances RB3 and RB4 between the circuit board 600a and the touch circuit board 700. That is, if it is known that the bonding resistance between the display panel 1001 and the circuit board 600a is the normal state, when the bonding resistance inspected according to the exemplary embodiment shown in FIG. 11 is determined to be normal, the bonding resistances RB3 and RB4 between the circuit board 600a and the touch circuit board 700 may be determined to be normal. In contrast, when the inspected bonding resistance is determined to be abnormal, the bonding resistances RB3 and RB4 between the circuit board 600a and the touch circuit board 700 may be determined to be abnormal. If the bonding resistance between the display panel 1001 and the circuit board 600a is abnormal, the bonding process is again performed after removing the bonding between the display panel 1001 and the circuit board 600a such that the bonding between the display panel 1001 and the circuit board 600a has bonding resistance of the normal range, and then the bonding resistance inspection according to this exemplary embodiment may be performed.

A display device capable of inspection of the bonding resistance between the display panel 1001 and the circuit board 600a according to another exemplary embodiment will now be described with reference to FIG. 12 and FIG. 13.

Figure 12:
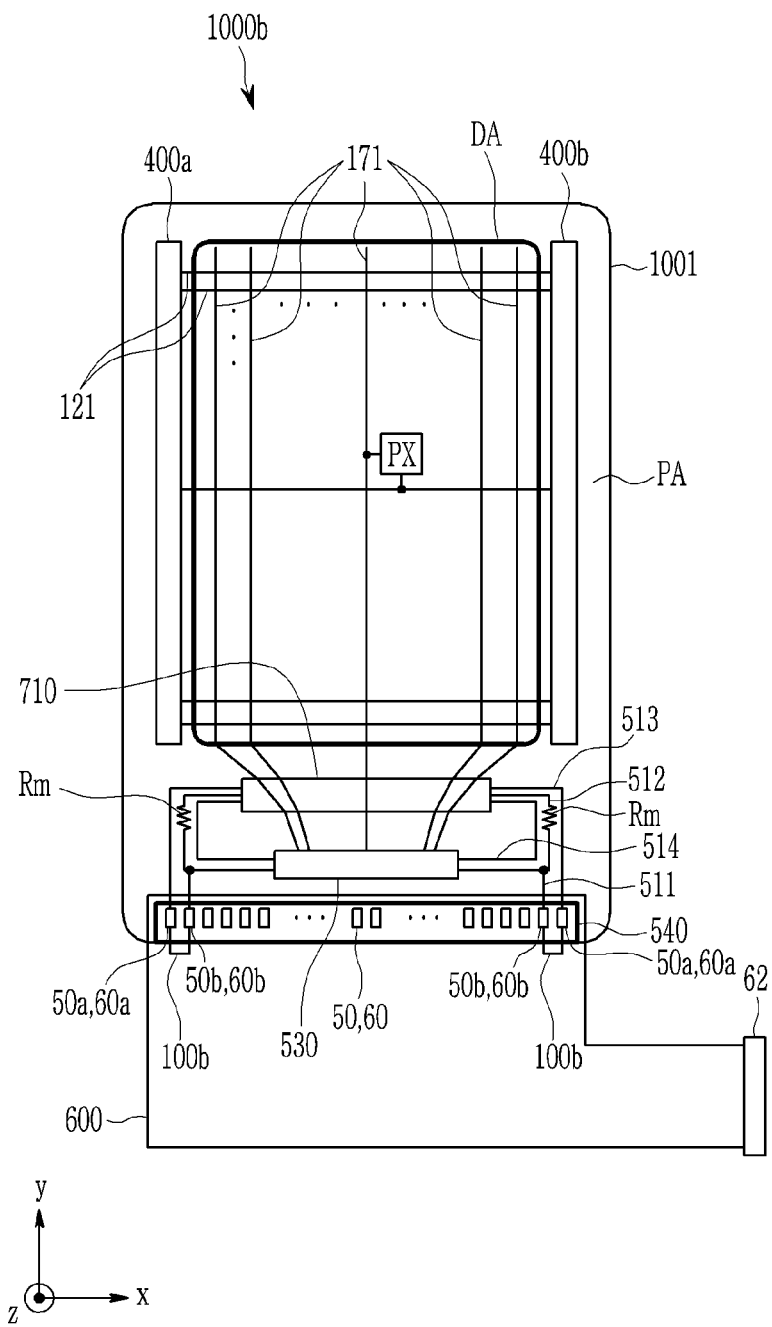
FIG. 12 is a plan view of still another exemplary embodiment of a display device according to the invention.
Figure 13:
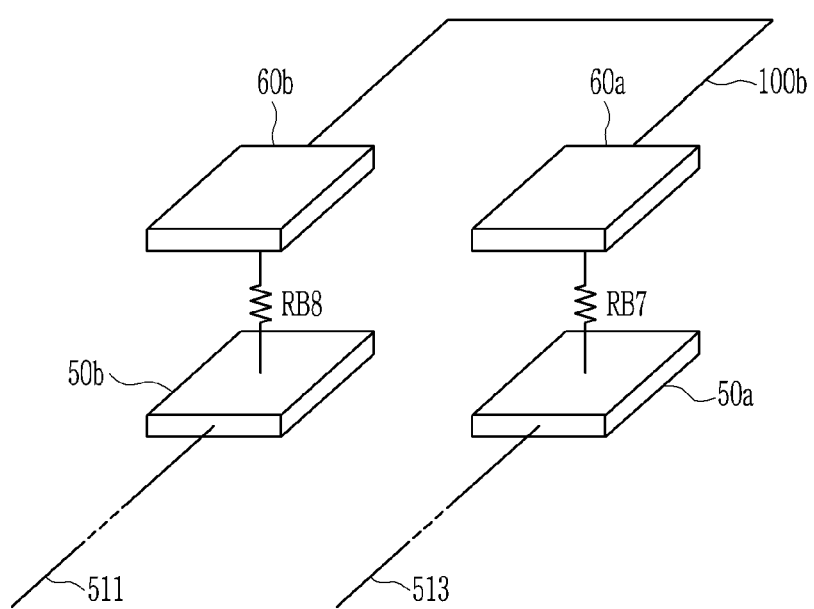
FIG. 13 is a view showing still another exemplary embodiment of constituent elements for measuring a bonding resistance of a display device according to the invention.

Referring to FIG. 12 and FIG. 13, the display device 1000b according to another exemplary embodiment is the same as most of the above-described display device 1000. The circuit board 600 may include a plurality of pads 60 bonded and connected to the pads 50 of the pad unit 540 of the display panel 1001. One pad 60a among the pads 60 may be bonded and electrically connected to the pad 50a of the display panel 1001, and another pad 60b among the pads 60 may be bonded and electrically connected to the pad 50b of the display panel 1001.

The circuit board 600 may be bent at the lower end of the display panel 1001 to be wrapped behind the display panel 1001 such that most of the circuit board 600 is invisible in a front plan view.

Referring to FIG. 13 along with FIG. 12, the bonding resistance to be inspected in this exemplary embodiment may include a sum of a value of the resistance RB7 between two pads 50a and 60a facing and bonded to each other between the display panel 1001 and the circuit board 600 and a value of the resistance RB8 between two pads 50b and 60b facing and bonded to each other.

The bonding region 850 in the above-described exemplary embodiment shown in FIG. 2 to FIG. 4 may correspond to the pad unit 540 in the exemplary embodiment shown in FIG. 12 and FIG. 13, the pads 80a and 80b of the bonding region 850 may correspond to the pads 50a and 50b, and the pads 90a and 90b of the bonding region 850 may correspond to the pads 90a and 90b, respectively.

Two pads 60a and 60b disposed at the circuit board 600 for measuring of the bonding resistance are electrically connected to each other through a connection wire 100b disposed on the circuit board 600 or are directly connected to each other, thereby forming one shorting pad. Accordingly, the wire 511, the pad 50b, the pad 60b, the connection wire 100b, the pad 60a, the pad 50a, and the wire 513 that are sequentially connected may form the circuit for measuring of the bonding resistance. The wire 511 may transmit the inspection data voltage to the pad 50b, and the wire 513 may transmit the detection voltage including the bonding resistance information (e.g., the sum of two resistances RB7 and RB8) between the display panel 1001 and the circuit board 600 to the inspection circuit unit 510.

The inspection method of the bonding resistance is the same as that described above such that the detailed description related thereto is omitted. In this exemplary embodiment, the bonding resistance information inspected though the lighting state of the display area DA may determine the normality of the bonding resistances RB7 and RB8 between the circuit board 600 and the display panel 1001.

According to another exemplary embodiment, particularly in the exemplary embodiment shown in FIG. 7 to FIG. 11, the driving circuit unit 530 may be mounted on the circuit board 600a. In this case, the wire 511 connected to the driving circuit unit 530 may be connected directly to the pad 61b on the circuit board 600a without passing through the bonding region of the display panel 1001 and the circuit board 600a, and the wires 512 and 514 connected to the driving circuit unit 530 may be connected to the inspection circuit unit 510 through the bonding region of the display panel 1001 and the circuit board 600a.

According to the inspection method of the bonding resistance according to an exemplary embodiment, the normality of the bonding resistance between the circuit board 600a and the touch circuit board 700 may be determined. That is, according to the exemplary embodiment, the bonding resistance including a sum of a value of the resistance RB3 between two pads 61a and 70a facing and bonded to each other between the touch circuit board 700 and the circuit board 600a and a value of the resistance RB4 between two pads 61b and 70b facing and bonded to each other may be inspected.

According to another exemplary embodiment, the inspection circuit unit 510 along with the driving circuit unit 530 may be formed or mounted on the circuit boards 600 and 600a.

While this invention has been described in connection with what is considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:
1. A display device comprising:
a first substrate including a display area and a peripheral area outside the display area,
a plurality of pixels disposed in the display area;
a plurality of data lines connected to the plurality of pixels;
an inspection circuit unit disposed in a peripheral area outside the display area and connected to the data lines;
a driving circuit unit disposed in the peripheral area and connected or configured to be connectable to the data lines;

a first wire and a second wire disposed on the first substrate and connected to the driving circuit unit;

a third wire disposed on the first substrate connected to the inspection circuit unit; and a bonding region disposed in the peripheral area and comprising a plurality of pads, wherein the inspection circuit unit comprises a first switching element and a second switching element, the first switching element is electrically connected to a first data line among the plurality of data lines and electrically connected to the third wire, the second switching element is electrically connected to a second data line among the plurality of data lines and electrically connected to the second wire, the plurality of pads comprises a first pad, a second pad, a third pad, and a fourth pad, the first pad and the second pad are electrically connected to each other via a first conductor, the third pad and the fourth pad are electrically connected to each other via a second conductor, the second pad and the fourth pad are disposed on a second substrate and are electrically connected to each other through a connection part disposed on the second substrate, and the first pad is disposed on the first substrate and electrically connected to the third wire, and the third pad is disposed on the first substrate and electrically connected to the first wire.

2. The display device of claim 1, wherein a color represented by pixels connected to the first data line among the plurality of pixels and a color represented by pixels connected to the second data line among the plurality of pixels are different from each other.

3. The display device of claim 2, wherein the second wire comprises a matching resistor having a resistance corresponding to a normal bonding resistance of the bonding region.

4. The display device of claim 3, further comprising a fourth wire connected to the driving circuit unit, wherein the fourth wire is electrically connected to control terminals of the first and second switching elements in the inspection circuit unit.

5. The display device of claim 1, wherein the first wire and the second wire are connected to each other at a node.

6. The display device of claim 1, wherein the first conductor and the second conductor comprise conductive balls included in an anisotropic conductive film disposed between the at first substrate and the second substrates.

7. The display device of claim 1, wherein the first substrate and the second substrate are bonded to each other in the bonding region, and the inspection circuit unit is disposed on the first substrate.

8. The display device of claim 1, wherein the first substrate and the second substrate are bonded to each other on the bonding region, a third substrate bonded and electrically connected to the first substrate is further comprised.

9. The display device of claim 1, wherein the first substrate and the second substrate are bonded to each other in the bonding region, and a third substrate bonded to the second substrate is further comprised.

10. The display device of claim 9, further comprising a touch sensing layer disposed on first substrate, wherein the third substrate is electrically connected to a pad unit of the touch sensing layer.

11. The display device of claim 1, wherein at least one pad among the first pad, the second pad, the third pad, and the fourth pad is disposed closer to an edge than to a center of the bonding region.

12. The display device of claim 1, wherein each of the first substrate and the second substrates is of a flexible film type.

13. A display device comprising:

a display panel comprising a first substrate including a display area and a peripheral area disposed outside the display area;

a first circuit board including a second substrate bonded to the display panel; and a second circuit board including a third substrate bonded to the first circuit board, wherein the display panel comprises a plurality of pixels disposed in the display area, a plurality of data lines connected to the plurality of pixels, an inspection circuit unit disposed in the peripheral area and connected to the data lines, a driving circuit unit disposed in the peripheral area, a first wire and a second wire connected to the driving circuit unit, and a third wire connected to the inspection circuit unit, the first circuit board and the second circuit board comprise a bonding region comprising a plurality of pads, the inspection circuit unit comprises a first switching element and a second switching element, the first switching element is electrically connected to a first data line among the plurality of data lines and to the third wire, the second switching element is electrically connected to a second data line among the plurality of data lines and to the second wire, the plurality of pads comprises a first pad, a second pad, a third pad, and a fourth pad, the first pad and the second pad being electrically connected to each other via a first conductor, and the third pad and the fourth pad being electrically connected to each other via a second conductor, the second pad and the fourth pad are disposed at the second circuit board and are electrically connected to each other, and the first pad is electrically connected to the third wire, and the third pad is electrically connected to the first wire.

14. The display device of claim 13, wherein a color represented by pixels connected to the first data line among the plurality of pixels and a color represented by pixels connected to the second data line among the plurality of pixels are different from each other.

15. The display device of claim 14, wherein the second wire comprises a matching resistor having a resistance corresponding to a normal bonding resistance of the bonding region.

16. The display device of claim 15, further comprising a fourth wire connected to the driving circuit unit, wherein the fourth wire is electrically connected to control terminals of the first and second switching elements in the inspection circuit unit.

17. A display device comprising:

a plurality of pixels;

a plurality of data lines connected to the plurality of pixels;

an inspection circuit unit connected to the plurality of data lines;

a driving circuit unit connected or configured to be connectable to the plurality of data lines;

a bonding region comprising a first pad, a second pad, a third pad, and a fourth pad, the first pad and the second pad being electrically connected to each other through a first conductor, and the third pad and the fourth pad being electrically connected to each other through a second conductor;

a first wire connected to the driving circuit unit and the third pad;

a second wire connected to the driving circuit unit and the inspection circuit unit; and a third wire connected to the inspection circuit unit and the first pad, wherein the second pad and the fourth pad are electrically connected to each other.

18. The display device of claim 17, wherein the first switching element is electrically connected to a first data line among the plurality of data lines and to the third wire, the second switching element is electrically connected to a second data line among the plurality of data lines and to the second wire, and a color represented by pixels connected to the first data line among the plurality of pixels and a color represented by pixels connected to the second data line among the plurality of pixels are different from each other.

19. An inspection method of a bonding resistance, in a display device comprising a plurality of pixels, a plurality of data lines connected to the plurality of pixels, an inspection circuit unit connected to the plurality of data lines, a driving circuit unit connected or configured to be connectable to the plurality of data lines, a bonding region comprising a first pad and a second pad electrically connected to each other through a first conductor, and a third pad and a fourth pad electrically connected to each other through a second conductor, a first wire connected to the driving circuit unit and the third pad, a second wire connected to the driving circuit unit and the inspection circuit unit, and a third wire connected to the inspection circuit unit and the first pad, wherein the second pad and the fourth pad are electrically connected to each other, the method comprising:

applying, by the driving circuit unit, a first inspection data voltage of a first gray level to the first wire and the second wire;

applying, by the driving circuit unit, a second inspection data voltage of a second gray level to the first wire and the second wire; and inspecting a lighting state of the plurality of pixels and determining whether a bonding resistance of the bonding region is normal.

20. The inspection method of claim 19, wherein it is determined that the bonding resistance is normal when the plurality of pixels entirely emit light of a same gray level, and it is determined that the bonding resistance is abnormal when pixels electrically connected to the third wire among the plurality of pixels emit light of different luminance from light emitted by the other pixels of the plurality of pixels.

* * * * *